US006507233B1

(12) United States Patent
Parfenchuck et al.

(10) Patent No.: US 6,507,233 B1
(45) Date of Patent: Jan. 14, 2003

(54) METHOD AND CIRCUIT FOR COMPENSATING $V_T$ INDUCED DRIFT IN MONOLITHIC LOGARITHMIC AMPLIFIER

(75) Inventors: Jeffrey B. Parfenchuck; David M. Jones, both of Tucson; R. Mark Stitt, II, deceased, late of Tuscon, all of AZ (US), by Robert Mark Stitt, I, legal representative

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/920,220

(22) Filed: Aug. 2, 2001

(51) Int. Cl.[7] .......... H01L 35/00

(52) U.S. Cl. .......... 327/513; 327/350

(58) Field of Search .......... 327/51, 52, 346, 327/350, 351, 362, 512, 513, 564–566

(56) References Cited

U.S. PATENT DOCUMENTS

| | | | | |
|---|---|---|---|---|
| 4,990,803 A | | 2/1991 | Gilbert | 307/492 |
| 5,471,132 A | * | 11/1995 | Ryat | 323/315 |
| 5,481,218 A | * | 1/1996 | Nordholt et al. | 327/350 |
| 5,805,011 A | * | 9/1998 | Comino | 327/350 |
| 5,877,645 A | * | 3/1999 | Comino et al. | 327/307 |
| 6,229,375 B1 | * | 5/2001 | Koen | 327/308 |

OTHER PUBLICATIONS

"LOG100 Precision Logarithmic and Log Ratio Amplifier", Burr–Brown Corporation, 1981.

"What's All This Logarithmic Stuff, Anyhow", by Robert A. Pease, Electronic Design, Jun. 14, 1989, pp. 111–113.

"Function Circuits" by Wong and Ott, McGraw–Hill Publishing Company, New York, 1976, p. 58.

* cited by examiner

*Primary Examiner*—My-Trang Nu Ton

(74) *Attorney, Agent, or Firm*—W. Daniel Swayze, Jr.; W. James Brady; Frederick J. Telecky, Jr.

(57) ABSTRACT

A temperature-compensated monolithic logarithmic amplifier includes a logarithmic amplifier cell (26) configured to produce a logarithmic voltage signal (V3) representative of a difference between a first voltage (V1) developed across a first PN junction device (D1) in response to an input signal ($I_{in}$) and a second voltage (V2) developed across a second PN junction device (D2) in response to a reference signal ($I_{ref}$) and an output circuit (36) including an output amplifier (19), a temperature-dependent first resistive element (R1) having a positive temperature coefficient, and a second resistive element (R2). The output circuit (36) produces a temperature-compensated output signal ($V_{out}$) in response to the logarithmic voltage signal (V3). The first resistive element (R1) is composed of conductive aluminum or aluminum alloy interconnection metallization that also is utilized as interconnection metallization throughout the monolithic logarithmic amplifier.

33 Claims, 5 Drawing Sheets

METHOD AND CIRCUIT FOR COMPENSATING $V_T$ INDUCED DRIFT IN MONOLITHIC LOGARITHMIC AMPLIFIER

BACKGROUND OF THE INVENTION

The invention relates to monolithic logarithmic amplifier integrated circuits and to methods for logarithmic conversion of an input signal.

Logarithmic amplifiers have been used to provide various functions. The closest prior art is believed to be the assignee's hybrid integrated circuit LOG100 logarithmic and log ratio amplifier, the article "What's All This Logarithmic Stuff, Anyhow?", by Robert A. Pease, Electronic Design, Jun. 14, 1989, pp. 111–113. Also see the text "Function Circuits" by Wong and Ott, McGraw-Hill Publishing Company, New York, 1976, page 58. Logarithmic amplifiers have been used in signal compression wherein the compressive effects of the logarithmic transfer function are useful. For example, use of the assignee's LOG100 logarithmic amplifier connected ahead of an eight-bit analog-to-digital converter can produce equivalent 20-bit converter dynamic range.

FIG. 1 is a schematic diagram of the assignee's above mentioned hybrid integrated circuit LOG100 logarithmic amplifier. Referring to FIG. 1, the logarithmic amplifier 1A includes a first operational amplifier 11 (also referred to as operational amplifier A1) having its (–) input connected to an external input terminal 14 into which an input current $I_{in}$ is provided by the user. The (+) input of operational amplifier 11 is connected to ground. The output of operational amplifier 11 is connected by conductor 13 to the emitter of an NPN transistor Q1, the collector of which is connected to input terminal 14. The emitter of transistor Q1 is also connected by conductor 13 to the emitter of a matched NPN transistor Q2 having its base connected to ground and its collector connected to both an external reference current terminal 15 into which a reference current $I_{ref}$ is supplied by the user, and to the (–) input of a second operational amplifier 19 (also referred to as operational amplifier A2) having its (+) input connected to ground. The output of operational amplifier 19 is connected to an external output conductor 17 on which an output voltage $V_{out}$ representative of the log ratio of $I_{in}/I_{ref}$ is produced. The base of transistor Q1 is connected to an external terminal 16. $V_{out}$ is connected to one terminal of a thin film resistor R2, the other terminal of which is connected to conductor 16. A "composite" temperature-dependent resistor R1 having a large positive temperature coefficient (TC) is coupled between conductor 16 and ground. Resistor R1 includes a 270 ohm thin film resister R1*b* connected between conductor 16 and one terminal of a 220 ohm thermistor R1*a,* the other terminal of which is connected to ground. Composite resister R2 may be a selectable parallel combination of thin film resisters each of which has one terminal connected to terminal 16 and another terminal connected to enable the user to set the resistance of R2.

Logarithmic amplifier 1A of FIG. 1 is implemented as a hybrid integrated circuit. The thermistor R1*a* is formed on a discrete chip that is bonded onto the hybrid integrated circuit. Because of its large size, the logarithmic amplifier 1 of prior art FIG. 1 must be packaged in a larger package.

FIG. 2 shows a schematic diagram of another prior art logarithmic amplifier 1B similar to that of FIG. 1 except that transistors Q1 and Q2 have been replaced by (or are represented by) diodes D1 and D2, respectively.

Generally, it is more convenient and less expensive to integrate all the elements of a circuit into a single chip. Furthermore, monolithic construction also facilitates assembly of the circuit into small surface mount packages, such as the SO-14. Accordingly, the prior art logarithmic amplifier shown in FIG. 1 has the disadvantages that the hybrid LOG100 product is not "compatible with" ordinary monolithic integrated circuit (IC) technology. However, adding the capability of providing a conventional thermistor in a conventional IC process would have resulted in additional complexity and cost.

Thus, the LOG100 design shown in FIG. 1 was considered impractical to implement on a single chip, because a thermistor which could, as a practical matter, have been provided on the same chip along with the amplifier circuitry and thin film resisters, was not available. It would have been considered impractical, in view of the benefit, to add the semiconductor processing steps that would have been needed to include a thermistor in a single-chip implementation of the LOG100.

Until now no one has provided a logarithmic amplifier similar to the ones shown in FIGS. 1 and 2 integrated into a single monolithic chip and capable of being packaged in a small, inexpensive plastic package, such as a TSSOP-14 or a SO-14.

In the past, integrated circuit interconnection metallization generally has only been utilized for making very low resistance resisters. For example, very low value resisters, e.g., emitter resisters and shunt resisters having very small resistances have been formed of the integrated circuit interconnection metallization that also is used throughout the integrated circuit. U.S. Pat. No. 4,990,803 (Gilbert) issued Feb. 5, 1981 discloses a multi-stage logarithmic amplifier in which a front end PTAT resistive attenuator includes an input voltage divider circuit including a high temperature coefficient resistor and a fixed resistor in its transfer branch. The output of the attenuator is connected to a logarithmic cell circuit. U.S. Pat. No. 4,990,803 also discloses that the high temperature coefficient resistor can be a 30 ohm resistor fabricated from aluminum interconnection metallization provided during chip fabrication. An input attenuator is suitable for voltage inputs, but would shunt low level current inputs.

Thus, there has been a long-standing unmet need for a monolithic temperature-compensated logarithmic amplifier.

SUMMARY OF THE INVENTION

Accordingly, it is an object of the invention to provide a monolithic integrated circuit logarithmic amplifier and method which provide essentially temperature-compensated logarithmic amplification of an input signal.

It is another object of the invention to avoid the large physical size and high cost of prior hybrid integrated circuit logarithmic amplifiers.

It is another object of the invention to provide a small, low-cost temperature-compensated logarithmic amplifier, especially one that is suitable for measurement of light intensity in fiber-optic devices.

It is another object of the invention to avoid the difficulties of using discrete large positive-temperature-coefficient thermistors in logarithmic amplifiers.

Briefly described, and in accordance with one embodiment, the invention provides a temperature-compensated monolithic logarithmic amplifier including a logarithmic amplifier cell (26) configured to produce a logarithmic voltage signal (V3) representative of a difference between a first voltage (V1) developed across a first PN junction device (D1) in response to an input signal ($I_{in}$) and a second voltage (V2) developed across a second PN junction device (D2) in response to a reference signal ($I_{ref}$). The logarithmic amplifier includes an output circuit (36) including an output amplifier (A2), a temperature-dependent first resistive element (R1) having a positive first temperature coefficient, and a second resistive element (R2) having a second temperature coefficient that is of substantially lower magnitude than the first temperature coefficient, the first (R1) and second (R2) resistive elements being coupled as a voltage divider between an output of the output amplifier (A2) and a reference conductor (GND) to provide a feedback signal to an input of the output amplifier (A2), the output circuit (36) being configured to produce a temperature-compensated output signal ($V_{out}$) in response to the logarithmic voltage signal (V3). A temperature-dependent third resistive element (R1*a*) included in the first resistive element (R1) is composed of conductive material which is integral with a semiconductor manufacturing process utilized to fabricate the monolithic logarithmic amplifier circuit. In one embodiment, the conductive material is aluminum or aluminum alloy interconnection metallization utilized as interconnection metallization throughout the monolithic logarithmic amplifier.

DETAILED DESCRIPTION OF THE PREFERRED EMBODIMENTS

Figure 2:
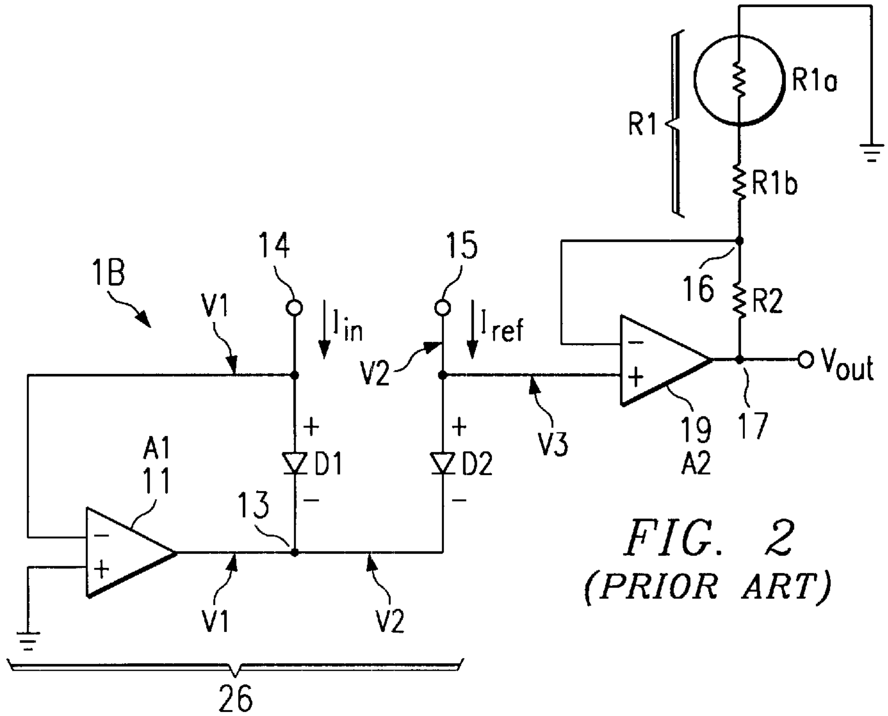
FIG. 2 (PRIOR ART)
FIG. 2 is a schematic diagram of another prior art logarithmic amplifier.
Figure 3:
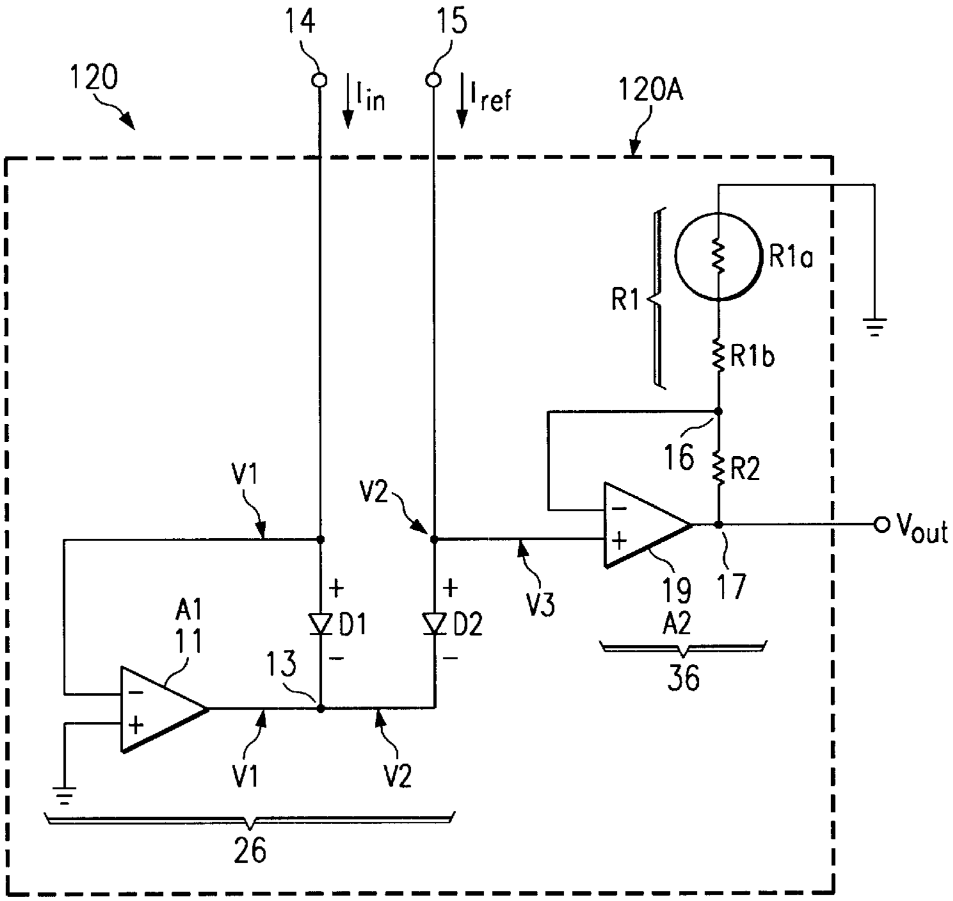
FIG. 3 is a schematic diagram of a logarithmic amplifier according to the present invention, having a current input signal.
Figure 9:
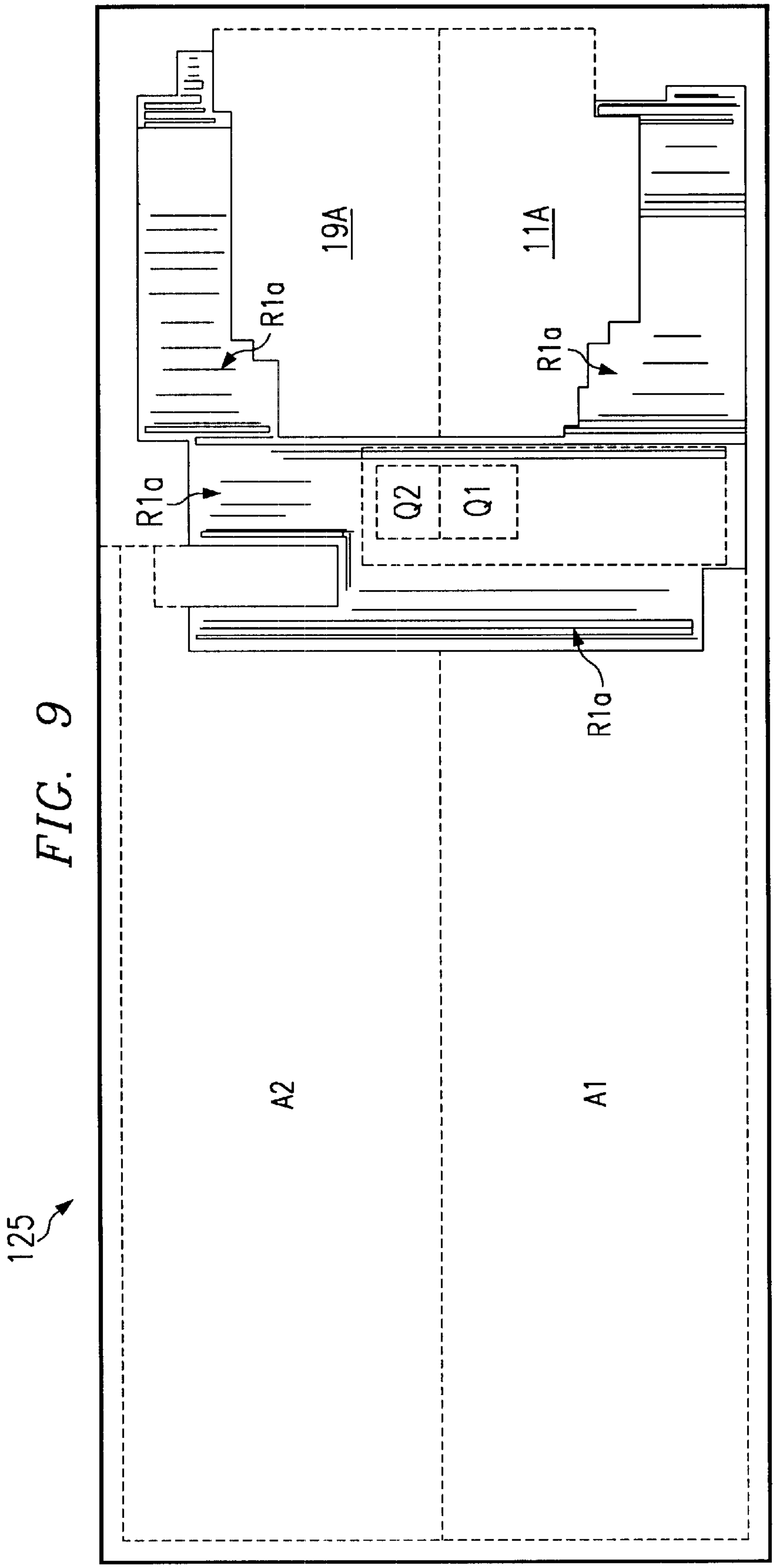
FIG. 9 is a plan view that approximately illustrating the general layout of the monolithic integrated circuit logarithmic amplifier of FIG. 8, and the general layout of the serpentine aluminum interconnection metallization resistor R1*a*.

FIG. 3 is a schematic diagram of a monolithic integrated circuit logarithmic amplifier 120 of the present invention. Logarithmic amplifier 120 is similar to logarithmic amplifier 1B of prior art FIG. 2. However, in logarithmic amplifier 120, all of the circuitry is included on a single monolithic chip 120A. Thermistor Ri of FIG. 2. is replaced by a positive TC resister R1 which includes a large serpentine aluminum interconnection metallization resistor R1*a* composed of the same kind of aluminum or aluminum alloy interconnection metallization which is used to fabricate the metal interconnections throughout the chip. (Subsequently described FIG. 9 illustrates the serpentine structure of interconnection metallization resistor R1*a*.) Positive TC resister R1 also includes a conventional thin-film resister R1*b*. Typically, resister R2 is a thin film resister, typically composed of nichrome (NiCr) or sichrome (SiCr), which is essentially temperature-independent.

In one embodiment of the invention, aluminum interconnection metallization resister R1*a* has a resistance of approximately 200 ohms, which is very large compared to the resistance of any known aluminum interconnection metallization resistor, and is formed by a large serpentine arrangement of aluminum metallization approximately 0.35 mils wide and approximately 10,000 Angstrom units thick. However, it may be practical for aluminum interconnection metallization resistor R1*a* to have a lower resistance, perhaps a low as 100 ohms, or even less. The thin film resisters described herein can be composed of nichrome. An exemplary value of resister R1*b* is 30 ohms, and a typical value of resister R2 is 3375 ohms. Typically, the aluminum interconnection metallization resister R1*a* occupies approximately 10 percent of the area of the integrated circuit chip on which the logarithmic amplifier is formed. A typical value of $I_{in}$ is in range of 1 nanoampere to 1 milliampere. A typical value of $I_{ref}$ also is in the range of 1 nanoampere to 1 milliampere.

As is well known, a semiconductor PN junction, such as a silicon PN junction, can be used as a predictable element for log conversion. The base-emitter voltage of a forward-biased PN junction is a fairly accurate logarithmic function of current across the junction. The voltage across the forward-biased silicon junction is approximated by:

$$V_{be}=(kT/q)Ln(I/I_s),$$

where:

I=current across the junction

Is=saturation current of the junction q=charge of an electron=1 eV k=Boltzmann's constant=$8.62*10^{-5}$ eV/K T=absolute temperature (degrees Kelvin (K)).

Therefore, referring to FIG. 3, $V1=(kT/q)Ln(I_{in}/I_{s1})$, $V2=(kT/q)Ln(I_{ref}/I_{s2})$, $V3=-V1+V2$.

If $I_{s1}=I_{s2}$, then:

$$V3(kT/q)Ln(I_{ref}/I_{in}),$$

where:

$I_{in}$=input current to logarithmic amplifier 120, $I_{ref}$=reference current to logarithmic amplifier 120, V3=output voltage from logarithmic converter cell 26, $V_{out}$=amplified output voltage of logarithmic amplifier 120.

Therefore, the output voltage V3 is approximately proportional to the absolute temperature (degrees Kelvin), and has a temperature coefficient (TC) of approximately 1/298 degrees Centigrade or about 3000 ppm/degree Centigrade at room temperature. The first-order correction for the drift of V3 can be provided by arranging for the gain of the amplifier (A2, R1, R2) to have a compensating TC of approximately −3000 ppm per degree Centigrade at 298 degrees Centigrade.

This can be accomplished by using a resister with the appropriate positive TC for composite resister R1. Composite resister R1 can be composed of the above mentioned aluminum metallization resister R1*a* and thin film resister R1*b* connected in series, one resister (e.g., R1*b*) having lower the lower or zero TC and the other resister (e.g., R1*a*) having a TC that is substantially higher than the positive TC (3000 ppm per degree Centigrade) needed for composite resister R1. By selecting the ratio of resisters R1*a* and R1*b* appropriately, a series combination with the needed TC of approximately +3000 ppm per degree Centigrade can be created. See page 58 of the above referenced Wong and Ott article.

It should be appreciated that it is much more convenient and much less expensive to manufacture an integrated circuit if all of the circuit elements can be included on the same monolithic chip. (However, in the past the difficulty of including the capability of providing a thermistor in a conventional integrated circuit wafer fabrication process was considered too costly to overcome, so it has been necessary to provide a large, expensive package to accommodate the multiple chips required for the above described prior art LOG100 product.)

In the described embodiments of the invention, the physically large, positive TC resister R1*a,* with a resistance of roughly 200 ohms, is provided by using the same standard aluminum interconnection metallization material that is also used in the semiconductor process to provide interconnection metallization throughout the chip. The aluminum metallization used by the assignee has a positive TC of approximately 4000 ppm/degree Centigrade, which is suitable for this application, as will be shown by the following example. (However, other levels of interconnect metallization commonly used in other integrated circuit manufacturing processes can be used, provided such metallization has the needed temperature coefficient.)

A convenient gain for the logarithmic converter of FIG. 3 would be obtained by configuring the logarithmic amplifier output at 1 volt per decade of input current. I.e., if $I_{ref}$ is equal to $10I_{in}$, then $V_{out}$=1 volt. Then, at 298 degrees K (i.e., at room temperature), $$V3=8.62*10^{-5}*298Ln(10)=0.0591 \text{ volts, for 1 volt per decade of input current.}$$

The gain of log converter cell 36 is equal to 1/0.0591, or 16.9 volts per volt.

Solving for the values of resisters R1 and R2 if in the logarithmic amplifier 120 of FIG. 3:

If $R1t=R1(1+tcR1(t-tnom))$, then, assuming no thermal drift of R2, where t=temperature tnom=nominal temperature, e.g., room temperature tcR1=temperature coefficient of R1.

Solving for the gain drift of the non-inverting operational amplifier 19:

$$g0+1+R2/R1,$$

$$gt=1+R2/[R1(1+tcR1(t-tnom))],$$

where g0=gain of operational amplifier 19 at t=tnom gt=gain of operational amplifier 19 as a function of temperature t.

If the gain temperature coefficient (i.e., the gain drift) is tcg, $$tcg=D[gt,\ t]/g0,$$

where D[gt, t] gives the partial derivative of gt with respect to temperature t, then $$tcg=-R2*tcR1/[(R1+R2)(-1-t*tcR1+tcR1*tnom)^2].$$

At t=tnom, $$tcg=-R2*tcR1/(R1+R2).$$

Solving for the needed value of tcR1 at G=16.9 (i.e., R2/R1=15.9), $$R1=1, \text{ and } R2=15.9.$$

Solving for [tcg=0.003,tcR1] (i.e., solving for tcR1 given tcg=0.003):

$$tcR1=-0.00319.$$

Solving for the temperature coefficient of R1 if R1 is formed from two series-connected resisters R1*a* and R1*b:*

If $$R1at-R1a(1+tcR1a(t-tnom))$$

$$R1bt=R1b(1+tcR1b(t-tnom)),$$

$$tcR1=D[R1at+R1bt,t]/(R1a+R1b)=(R1a*tcR1a+R1b*tcR1b)/(R1a+R1b).$$

If tcR1*b*=0, then $$tcr1=R1a*tcR1a/(R1a+R1b).$$

Solving for R1*a* and R1*b* if tcR1*a*=0.004 and tcR1=0.00319:

$$R1b\geqq 0.2025,\ R1b\geqq 0.7975.$$

The conclusion is that temperature compensation at tnom can be achieved with resisters ratioed at the above indicated ranges of values. For example, if we ratio by 1000:

R1=15.9 kilohms (at zero tcr)

R2=1 kilohm (3190 tcr formed from series-connected R1*a*+R1*b*)

R1*a*=797.5 ohms (4000 ppm tcr, e.g., for aluminum alloy conductor)

R1*b*=202.5 ohms (at zero tcr).

Figure 4:
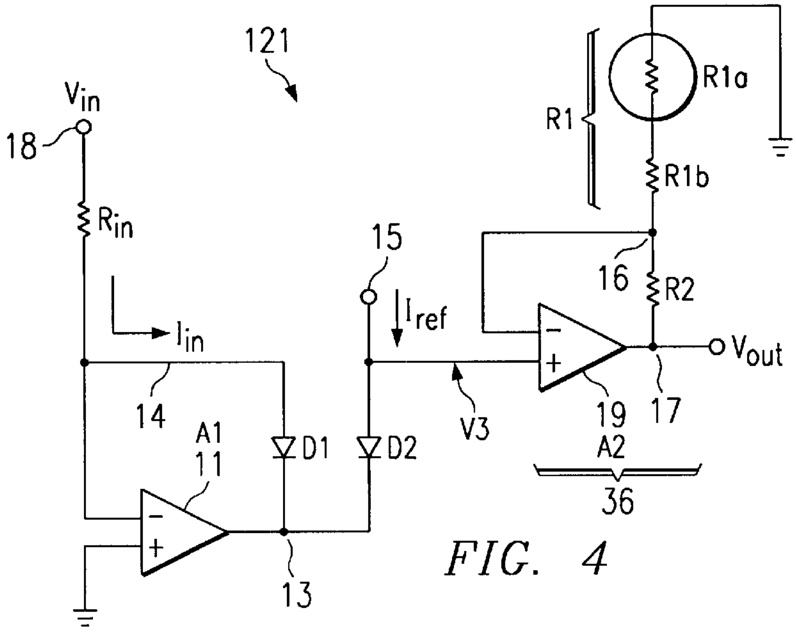
FIG. 4 is a schematic diagram of a logarithmic amplifier of the present invention, having a voltage input signal.

Although the logarithmic amplifier 120 of FIG. 3 is configured to receive an input current signal, various other configurations can be provided to allow use of an input voltage signal $V_{in}$. For example, FIG. 4 shows a logarithmic amplifier 121 which is a variation of the circuit of FIG. 3, modified to receive the voltage input signal $V_{in}$ on an external input conductor 18. An input resister $R_{in}$ is connected between input conductor 18 and an internal conductor 14. Since the voltage at the negative input of operational amplifier A1 is held at virtual ground, the resister $R_{in}$ connected by conductor 14 to the (−) input of operational amplifier A1 provides a suitable voltage-to-current conversion such that a current $I_{in}$ flowing in conductor 14 through diode (or P-N junction) D1 is equal to $V_{in}/R_{in}$. Otherwise, logarithmic amplifier 121 of FIG. 4 is essentially identical to logarithmic amplifier 120 of FIG. 3.

Figure 5:
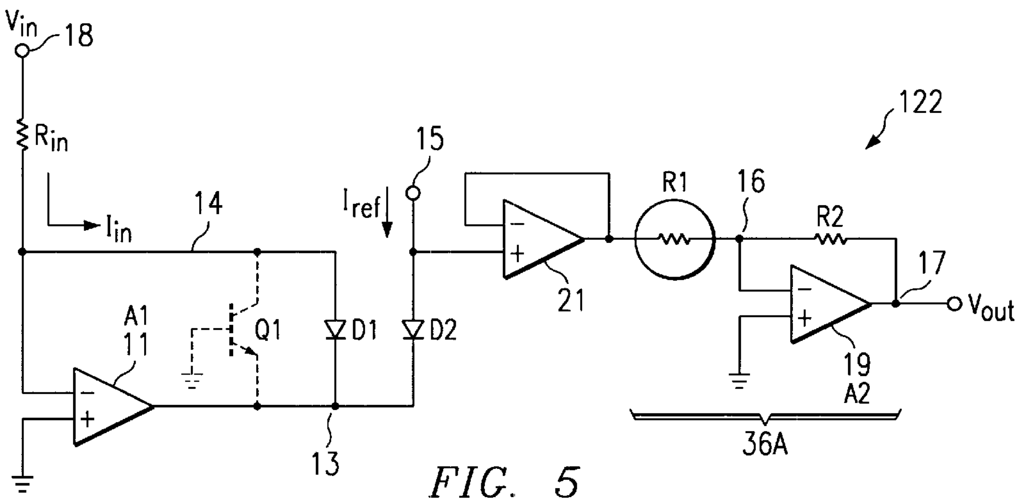
FIG. 5 is a schematic diagram of a logarithmic amplifier which is a variation of the logarithmic amplifier of FIG. 4.

The logarithmic amplifier 120 of FIG. 3 is configured with non-inverting amplifier circuitry A2,R1,R2 so as to provide gain and temperature compensation. However, various other logarithmic amplifier circuit configurations also can provide gain and temperature compensation in accordance with the present invention. For example, the logarithmic amplifier 122 shown in FIG. 5 is configured with an operational amplifier 19 in an inverting gain stage 36A so as to provide both gain and temperature compensation by using resister R1 as the temperature-dependent resister. Resistor R1 in FIG. 5 can be a single temperature-dependent resister as shown, or it can be a composite of an aluminum resister R1*a* and a thin film resistor R1*b* as shown in FIGS. 1–4. To accomplish this, a buffer amplifier 21 is coupled between conductor 15 and one terminal of temperature-dependent resister R1. The (+) input of buffer amplifier 21 is connected to reference input conductor 15. The output of buffer amplifier 21 is connected to its (−) input as well as to one terminal of temperature-dependent resister R1, the other terminal of which is connected by conductor 16 to the (−) input of operational amplifier 19 and to one terminal of feedback resister R2. The (+) input of operational amplifier 19 is connected to ground. The output of operational amplifier 19 is connected by conductor 17 to the other terminal of feedback resister R2.

Solving for the gain temperature coefficient tcg of inverting amplifier A2 in FIG. 5:

$$g0 = -R2/R1$$

$$\begin{aligned} gt &= -R2/R1t \\ &= -R2/[R1*(1+tcR1*(t-tnom))] \end{aligned}$$

$$\begin{aligned} tcg &= D[gt, t]/g0 \\ &= -tcR1/(1+tcR1*(t-tnom))^2. \end{aligned}$$

$$Att = tnom: \qquad tcg - tcR1.$$

Figure 6:
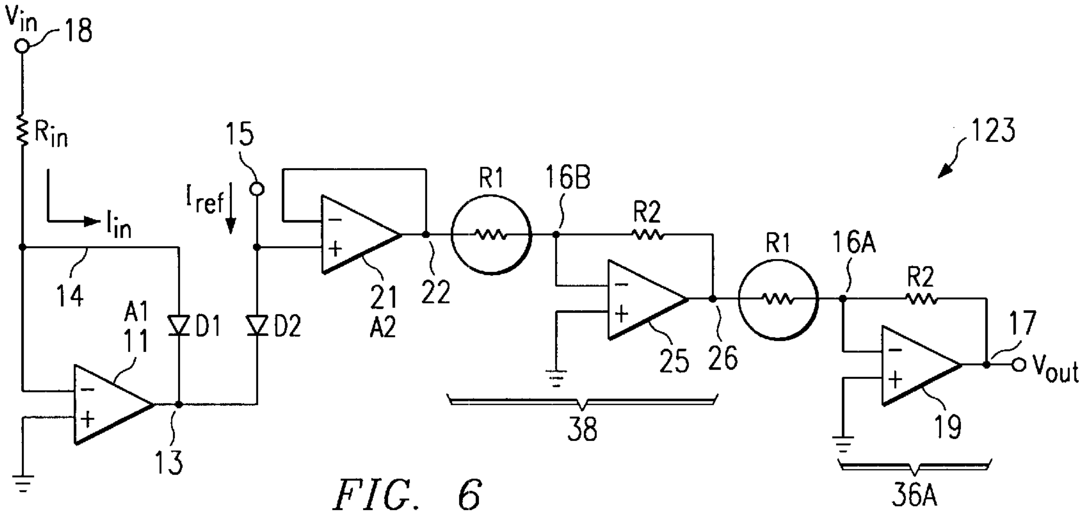
FIG. 6 is a schematic diagram of another logarithmic amplifier of the present invention.

Using two or more cascaded gain stages can boost overall gain drift so that resistive elements each having lower temperature coefficients (e.g., each having a temperature coefficient less than 1/298) can be used to accomplish temperature compensation of the logarithmic converter. For example, FIG. 6 shows another logarithmic amplifier 123 that could be formed on a single monolithic chip. Logarithmic amplifier 123 of FIG. 6 is similar to logarithmic amplifier 122 of FIG. 5, but is modified to include a second cascaded gain stage 38 including amplifier 25, a feedback resister R2, and a temperature-dependent resister R1 connected by conductor 16B, which is connected to the (−) input of amplifier 25. Second cascaded gain stage 38 can be similar or identical to gain stage 36A, and has its input connected to conductor 22 and its output connected by conductor 26 to the input of gain stage 36A. In this example, the gain stages 36A and 38 are the same, and the R1 resisters are the temperature-dependent elements.

Solving for the gain temperature coefficient of logarithmic amplifier 123 in FIG. 6, with the gain divided into two equal-gain cascaded inverting amplifier stages:

$$g0=(-R2/R1)^2$$

$$gt=(-R2/R1t)^2$$

$$tcg=D[gt,t]/g0$$

$$tcrg=-2*tcR1/(1+t*tcR1-tcR1*tnom)^3.$$

$$Att = tnom: \qquad tcg = -2*tcR1.$$

Solving for the gain temperature coefficient with the gain divided into "n" equal-gain cascaded inverting amplifier stages:

$$g0=(-R2/R1)^n$$

$$gt=(-R2/R1t)^n$$

$$tcg=D[gt,t]/g0$$

$$tcg=[n*tcR1\{R2/(R1(-1-t*tcR1+tcR1*tnom)\}^n]/[-(R2/R1)^n*(-1-t*tcR1+tcR1*tnom)].$$

$$Att = tnom: \qquad tcg = -n*tcR1.$$

Figure 7:
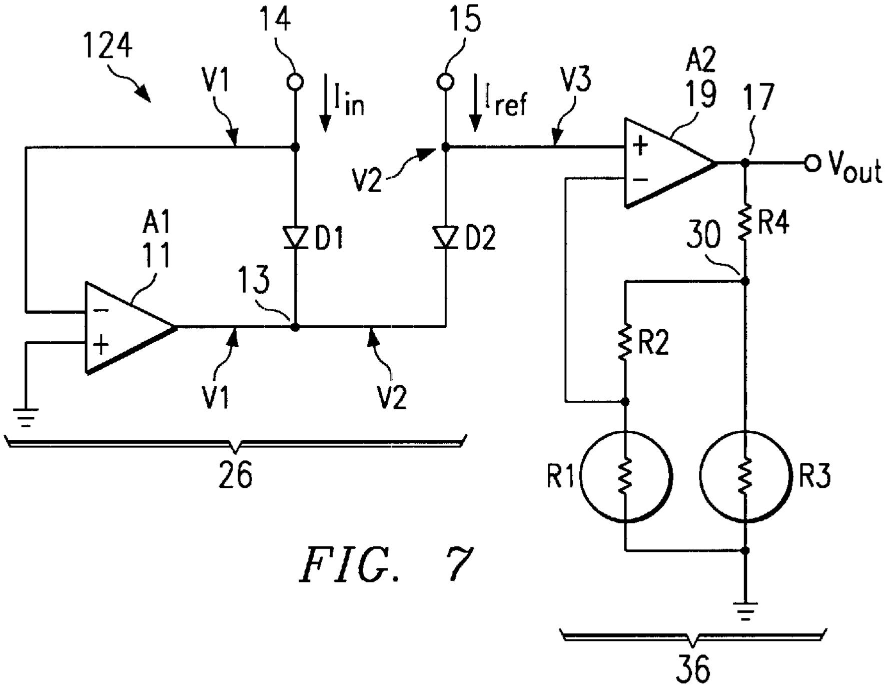
FIG. 7 is a schematic diagram of another amplifier of the present invention having a non-inverting output amplifier.

FIG. 7 shows a logarithmic amplifier 124 including a log amplifier cell 26, the log amplifier cell 26 driving an output stage 36 with a non-inverting amplifier 19 having compound feedback. The (+) input of amplifier 19 is connected to conductor 15. The output of amplifier 19 is connected by output conductor 17 to one terminal of a resister R4, the other terminal of which is connected by conductive 30 to 1 terminal of a resistor R2 and to one terminal of a temperature-dependent resister R3. The other terminal of temperature-dependent resister R3 is connected to ground. The other terminal of resister R2 is connected to the (−) input of amplifier 19 and to one terminal of another temperature-dependent resistor R1, the other terminal of which is connected to ground. By using multiple voltage dividers, this type of circuitry allows convenient use of low value resisters having a lower positive temperature coefficient than that of typical aluminum interconnect metallization material. For example, resister R1 could be implemented by a P-type diffused resister (with a temperature coefficient of approximately +1200 ppm/degrees Centigrade) formed at the same time that the P-type base regions are formed during fabrication of the chip.

The structure shown in FIG. 7 permits the output voltage on conductor 17 to be divided down by two or more successive voltage dividers, as shown, to a very low feedback voltage on the (−) input of amplifier 19 by using low-value temperature-dependent resistors R1 and R3 and relatively large value resisters R2 and R4 as shown to form the successive voltage dividers. The successive voltage divider structure shown increases the effect of the positive temperature coefficients of resisters R1 and R3, and thereby provides the desired temperature compensation of the logarithmic amplifier 124, using temperature-dependent resistors R2 and R4 having temperature coefficients which are substantially lower than the temperature coefficient of aluminum interconnection metallization material. (Although the basic operational assertive of FIG. 7 is understood, the mathematical analysis of the circuit of FIG. 7 is much more complex than the analysis for the other circuits disclosed, and has not been completed.) In this configuration, resisters R1 and R3 could be temperature-dependent resisters with positive temperature coefficients, and the gain depends on the resister ratios. Resistor R1 in FIG. 7 can be a single temperature-dependent resister as shown, or it can be a composite of an aluminum resister R1*a* and a thin film resistor R1*b* as shown in FIGS. 1–4.

Various other circuit configurations can be used to provide the logarithmic conversion functions in the present invention.

Figure 1:
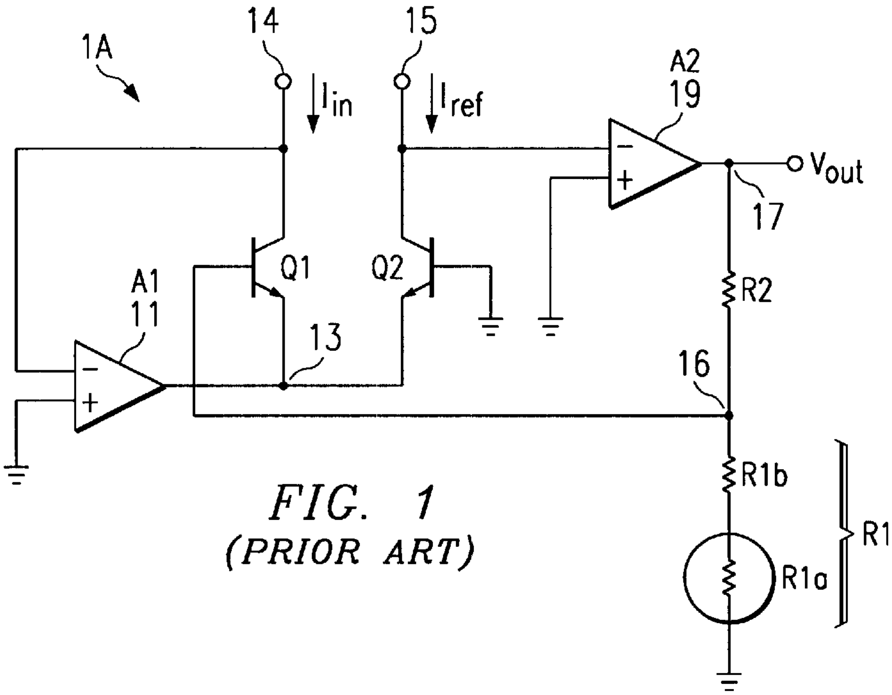
FIG. 1 (PRIOR ART)
FIG. 1 is a schematic diagram of a prior art logarithmic amplifier.
Figure 8:
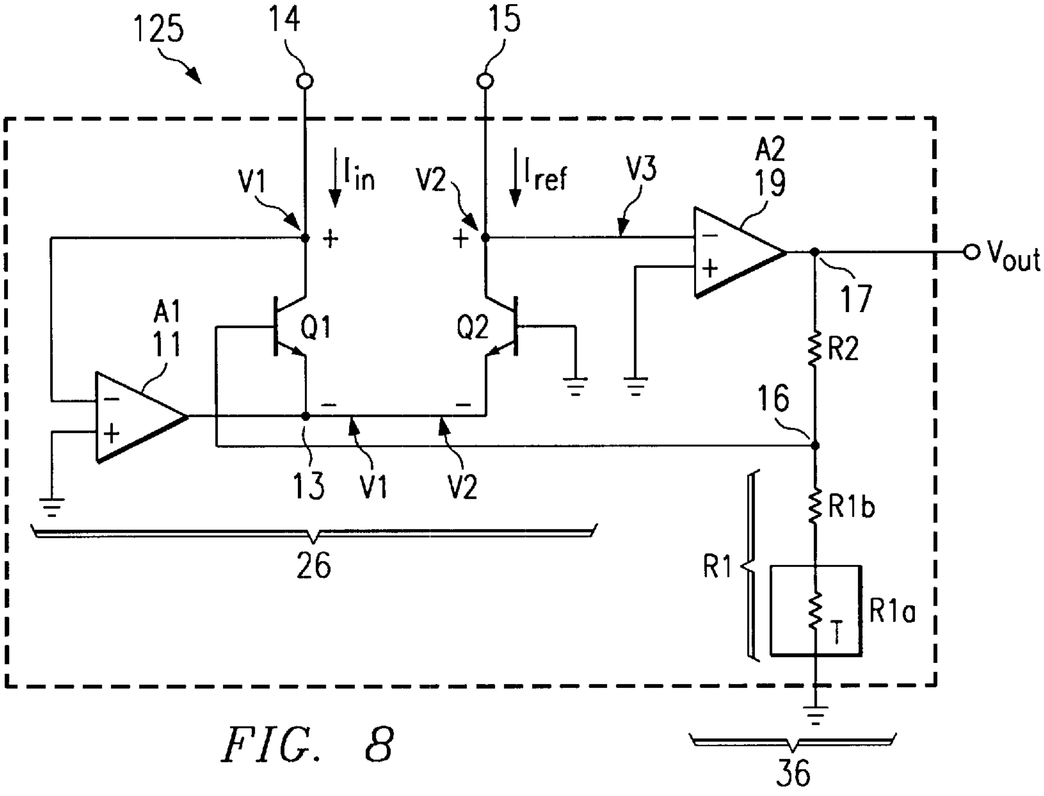
FIG. 8 it is schematic diagram of the preferred logarithmic amplifier of the present invention.

FIG. 8 shows a presently preferred embodiment of a monolithic logarithmic amplifier 125 wherein both the current input conductor 14 and the reference current conductor 15 are held at virtual ground by operational amplifiers 11 and 19, respectively. The difference between the logarithmic amplifier of FIG. 8 and the logarithmic amplifier of prior art FIG. 1 is that the prior art logarithmic amplifier is a hybrid integrated circuit device including a discrete thermistor on a separate chip utilized as the temperature-dependent element R1*a*, whereas the entire logarithmic amplifier 125 of FIG. 8 is provided on a single integrated circuit chip, with its temperature-dependent element R1*a* composed of a serpentine configuration of the ordinary aluminum interconnect metallization material that also is used throughout the chip for interconnection purposes, the large resistance of R1*a* notwithstanding. In FIG. 8, the dashed line designates the integrated circuit chip on which the entire logarithmic amplifier is provided, and the symbol for resister R1*a* represents a different integrated temperature-dependent than a discrete thermistor R1*a* shown in prior art FIG. 1.

As in FIGS. 3–7, composite temperature-dependent resister R1, which includes the serpentine aluminum metallization resister R1*a* and thin film resister R1*b*, is the temperature-dependent resister. In FIG. 8, the (−) input of operational amplifier 11 is connected to input conductor 14. The (+) of operational amplifier 11 is connected to ground. The output of operational amplifier 11 is connected by conductor 13 to the emitters of a pair of matched NPN transistors Q1 and Q2. The base of transistor Q2 is connected to ground. The second operational amplifier 19 has its (+) input connected to ground and its (−) input connected to the reference input conductor 15. The output of operational amplifier 19 is connected by output conductor 17 to one terminal of thin film resister R2. The other terminal of resister R2 is connected by conductor 16 to the base of transistor Q1 and to one terminal of composite resister R1, the other terminal of which is connected to ground. In this configuration:

$$V_{out}=k*Ln(I_{in}/I_{ref}),$$

where k is a scale factor.

FIG. 9 is a plan view of logarithmic amplifier 125 of FIG. 8, implemented on a single integrated circuit chip. The locations of most of the circuitry of operational amplifiers 11 and 19 are indicated by reference characters A1 and A2, respectively. Areas 11A and 19A designate the locations of a pair of auxiliary amplifiers that can be used if desired. The locations of transistors Q1 and Q2 are indicated. The serpentine aluminum metallization resister R1*a* is located in the available areas of the chip designated by the characters R1*a* in FIG. 9. The serpentine aluminum metallization resister R1*a* occupies roughly 10 percent of the area of the integrated circuit chip. However, aluminum metallization resister R1*a* does not need to be configured in the same serpentine fashion illustrated in FIG. 9. For example, the same length of metallization material could be laid out as a loop or spiral configuration or the like either within or "looped around" a peripheral portion of the integrated circuit chip. By way of definition, the term "serpentine" as used herein is intended to encompass both a generally "spiraled" configuration of the metallization material and a "non-spiraled" configuration as illustrated in FIG. 9.

The invention provides a versatile integrated circuit logarithmic and log ratio amplifier that produces the logarithm, log ratio or anti-log of an input current or input voltage relative to a reference current or reference voltage with high precision over a wide dynamic range of input signals. The drift of the kT/q term of the transistors Q1 and Q2 or diodes D1 and D2 is canceled, i.e. compensated, by the use of one or more relatively large-value resisters composed only of the standard aluminum or aluminum alloy metallization utilized as the integrated circuit interconnection metallization during processing of the integrated circuit wafers.

The described small, low-cost temperature-compensated logarithmic amplifier is especially useful for measurement of light intensities in fiber-optic devices.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. The temperature-dependent resister element could be composed of other interconnection metal or alloy metal material than the aluminum metallization and aluminum alloy metallization described above. For example, the temperature-dependent resister element also could be composed of doped silicon or doped polycrystalline silicon material. The PN junctions can be PN junctions of silicon transistors, and the diodes D1 and D2 can be diode-connected transistors. The semiconductor junctions can be provided as a different combination of silicon diodes and silicon transistors. For example, the semiconductor junctions can be provided as a transistor Q1 and a diode D2 as indicated by the dotted line structure of Q1 shown in FIG. 5. The disclosed logarithmic amplifier circuits can be easily modified so that the input current $I_{in}$ flows out of rather than into input terminal 14, and the reference current $I_{ref}$ flows out of rather than into reference terminal 15. The high temperature coefficient interconnection material does not necessarily have to be metallization material. For example, the high temperature coefficient interconnection material can be doped silicon interconnection material (such as P-type doped silicon material or N-type doped silicon material) or doped polycrystalline silicon interconnection material that is provided on the chip during fabrication thereof.

What is claimed is:

1. A temperature-compensated monolithic logarithmic amplifier circuit, comprising:

(a) a logarithmic amplifier cell configured to produce a logarithmic voltage signal representative of a difference between a first voltage developed across a first PN junction device in response to an input signal and a second voltage developed across a second PN junction device in response to a reference signal; and (b) an output circuit including an output amplifier, a temperature-dependent first resistive element having a positive first temperature coefficient and including interconnection metallization material formed on the monolithic logarithmic amplifier circuit simultaneously with formation of interconnection metallization elsewhere on the monolithic logarithmic amplifier circuit, and a second resistive element having a second temperature coefficient that is of substantially lower magnitude than the first temperature coefficient, the first and second resistive elements being coupled as a voltage divider between an output of the output amplifier and a reference conductor to provide a feedback signal to an input of the output amplifier, the output circuit being configured to produce a temperature-compensated output signal in response to the logarithmic voltage signal, the interconnection metallization material of the first resistive element being configured as a long structure of sufficiently high resistance to temperature-compensate the logarithmic voltage signal.

2. The temperature-compensated monolithic logarithmic amplifier circuit of claim 1 wherein the first resistive element is at least partially configured as a serpentine structure.

3. A temperature-compensated monolithic logarithmic amplifier circuit, comprising:

(a) a logarithmic amplifier cell configured to produce a logarithmic voltage signal representative of a difference between a first voltage developed across a first PN junction device in response to an input signal and a second voltage developed across a second PN junction device in response to a reference signal;

(b) an output circuit including an output amplifier, a temperature-dependent first resistive element having a positive first temperature coefficient, and a second resistive element having a second temperature coefficient that is of substantially lower magnitude than the first temperature coefficient, the first and second resistive elements being coupled as a voltage divider between an output of the output amplifier and a reference conductor to provide a feedback signal to an input of the output amplifier, the output circuit being configured to produce a temperature-compensated output signal in response to the logarithmic voltage signal;

(c) a temperature-dependent third resistive element included in the first resistive element, the third resistive element being composed of conductive material which is integral with a semiconductor manufacturing process utilized to fabricate the monolithic logarithmic amplifier circuit; and (d) a fourth resistive element included in the first resistive element, the fourth resistive element being composed of resistive material having a substantially lower magnitude temperature coefficient than the first temperature coefficient.

4. The temperature-compensated monolithic logarithmic amplifier circuit of claim 3 wherein the conductive material is aluminum interconnection metallization material.

5. The temperature-compensated monolithic logarithmic amplifier circuit of claim 4 wherein the conductive material is configured as a long, serpentine structure of sufficiently high resistance to temperature-compensate the logarithmic voltage signal.

6. The temperature-compensated monolithic logarithmic amplifier circuit of claim 4 wherein the conductive material is aluminum alloy interconnection metallization material.

7. The temperature-compensated monolithic logarithmic amplifier circuit of claim 6 wherein the conductive material is configured as a long, serpentine structure of sufficiently high resistance to temperature-compensate the logarithmic voltage signal.

8. The temperature-compensated monolithic logarithmic amplifier circuit of claim 4 wherein a temperature coefficient of the aluminum alloy interconnection metallization material is approximately +4000 ppm per degree Centigrade.

9. The temperature-compensated monolithic logarithmic amplifier circuit of claim 4 wherein a resistance of the third resistive element is greater than approximately 100 ohms.

10. The temperature-compensated monolithic logarithmic amplifier circuit of claim 9 wherein the second resistive element and the fourth resistive element are composed of thin film resistive material.

11. The temperature-compensated monolithic logarithmic amplifier circuit of claim 9 wherein the third resistive element occupies approximately 10 percent of the area of the integrated circuit chip on which the monolithic logarithmic amplifier circuit is formed.

12. The temperature-compensated monolithic logarithmic amplifier circuit of claim 3 wherein the conductive material is doped polycrystalline silicon interconnection material.

13. The temperature-compensated monolithic logarithmic amplifier circuit of claim 3 wherein the first PN junction device is a portion of a first diode.

14. The temperature-compensated monolithic logarithmic amplifier circuit of claim 13 wherein the second PN junction device is a portion of a second diode.

15. The temperature-compensated monolithic logarithmic amplifier circuit of claim 3 wherein the first PN junction device is a portion of a first transistor.

16. The temperature-compensated monolithic logarithmic amplifier circuit of claim 15 wherein the second PN junction device is a portion of a second transistor.

17. The temperature-compensated monolithic logarithmic amplifier of claim 15 wherein the second PN junction is a portion of a diode.

18. The temperature-compensated monolithic logarithmic amplifier circuit of claim 3 wherein the output amplifier is configured as a non-inverting operational amplifier including the temperature-dependent first resistive element and a second resistive element in a feedback circuit coupled between an output of the output amplifier and an inverting input of the output amplifier.

19. The temperature-compensated monolithic logarithmic amplifier circuit of claim 3 wherein the output amplifier is configured as an inverting operational amplifier including the temperature-dependent first resistive element and the second resistive element in a feedback circuit coupled between an output of the output amplifier and the inverting input of the output amplifier.

20. The temperature-compensated monolithic logarithmic amplifier circuit of claim 3 wherein the input signal is an input current and the reference signal is a reference current.

21. The temperature-compensated monolithic logarithmic amplifier circuit of claim 20 wherein the reference current is an externally applied reference current.

22. The temperature-compensated monolithic logarithmic amplifier circuit of claim 3 wherein the input signal is an input voltage, the logarithmic amplifier circuit including an input circuit including an input terminal receiving the input voltage and an input resistor having a first terminal connected to the input terminal and a second terminal coupled to the first PN junction device.

23. A temperature-compensated monolithic logarithmic amplifier circuit, comprising:

(a) a first conductor receiving a first current and a second conductor receiving a second current;

(b) a first transistor having a collector coupled to the first conductor, and a second transistor having a collector coupled to the second conductor and an emitter coupled to an emitter of the first transistor;

(c) a first operational amplifier having a non-inverting input connected to a reference voltage conductor, an inverting input coupled to the first conductor, and an output coupled to the emitters of the first and second transistors, a base of the second transistor being coupled to the reference voltage conductor;

(d) a second operational amplifier having a non-inverting input coupled to the reference voltage conductor, an inverting input coupled to the collector of the second transistor, and an output coupled to an output conductor;

(e) a temperature-compensating feedback circuit including a first resistive element and a second resistive element coupled in series between the reference voltage conductor and a third conductor, and a third resistive element coupled between the output conductor and the third conductor, the third conductor being coupled to a base of the first transistor, the first resistive element being composed of integrated circuit interconnection metallization material formed on the monolithic logarithmic amplifier circuit simultaneously with formation of integrated circuit interconnection metallization elsewhere on the monolithic logarithmic amplifier circuit, the integrated circuit interconnection metallization material of which the first resistive element is composed being configured as a long, serpentine structure of sufficiently high resistance to temperature-compensate the logarithmic voltage signal.

24. The temperature-compensated monolithic logarithmic amplifier circuit of claim 23 wherein the resistance of the first resistive element is greater than approximately 100 ohms.

25. The temperature-compensated monolithic logarithmic amplifier circuit of claim 23 wherein the first resistive element occupies roughly 10 percent of the area of an integrated circuit chip on which the monolithic logarithmic amplifier circuit is formed.

26. A temperature-compensated monolithic logarithmic amplifier circuit, comprising:

(a) a logarithmic amplifier cell configured to produce a logarithmic voltage signal representative of a difference between a first voltage developed across a first PN junction device in response to an input signal and a second voltage developed across a second PN junction device in response to a reference signal; and (b) a first output circuit including an output amplifier, a temperature-dependent first resistive element having a positive first temperature coefficient and including interconnection metallization material formed on the monolithic logarithmic amplifier circuit simultaneously with formation of interconnection metallization elsewhere on the monolithic logarithmic amplifier circuit, and a second resistive element having a second temperature coefficient that is of substantially lower magnitude than the first temperature coefficient, the first and second resistive elements of the first output circuit being coupled as a voltage divider between an output of the output amplifier of the first output circuit and a reference conductor to provide a feedback signal to an input of the output amplifier of the first output circuit;

(c) a second output circuit including an output amplifier, a temperature-dependent third resistive element having a positive third temperature coefficient and including interconnection metallization material formed on the monolithic logarithmic amplifier circuit simultaneously with formation of interconnection metallization elsewhere on the monolithic logarithmic amplifier circuit, and a fourth resistive element having a fourth temperature coefficient that is of substantially lower magnitude than the third temperature coefficient, the first and second output circuits being configured to produce a temperature-compensated output signal in response to the logarithmic voltage signal, the first and second resistive elements of the second output circuit being coupled as a voltage divider between an output of the output amplifier of the second output circuit and a reference conductor to provide a feedback signal to an input of the output amplifier of the second output circuit, the interconnection metallization material of the first resistive element being configured as a long, serpentine structure of sufficiently high resistance to temperature-compensate the logarithmic voltage signal.

27. A method of temperature compensating a logarithmic amplifier circuit, comprising:

(a) providing i. a logarithmic amplifier cell configured to produce a logarithmic voltage signal representative of a difference between a first voltage developed across a first PN junction device in response to an input signal and a second voltage developed across a second PN junction device in response to a reference signal, and ii. an output circuit including an output amplifier, a composite temperature-dependent resistive element including a temperature-dependent first resistive element having a positive first temperature coefficient and a second resistive element coupled in series with the first resistive element and having a temperature coefficient of substantially lower magnitude than the first temperature coefficient, and a third resistive element having a second temperature coefficient that is of substantially lower magnitude than the first temperature coefficient, the composite temperature-dependent resistive element and the third resistive element being coupled as a voltage divider between an output of the output amplifier and a reference conductor to provide a feedback signal to an input of the output amplifier, the output circuit being configured to produce a temperature-compensated output signal in response to the logarithmic voltage signal; and (b) forming the first resistive element from interconnection metallization configured as a long, serpentine structure having sufficiently high resistance to temperature-compensate the logarithmic voltage signal simultaneously with formation of interconnection metallization elsewhere on the monolithic logarithmic amplifier circuit.

28. A method of claim 27 wherein step (b) includes forming the serpentine structure long enough to provide a resistance of the first resistive element greater than approximately 100 ohms.

29. The method of claim 28 including configuring the serpentine structure to substantially surround an output portion of the output amplifier and an output portion of an operational amplifier included in the logarithmic amplifier cell.

30. A temperature-compensated monolithic logarithmic amplifier circuit, comprising:

(a) a logarithmic amplifier cell configured to produce a logarithmic voltage signal representative of a difference between a first voltage developed across a first PN junction device in response to an input signal and a second voltage developed across a second PN junction device in response to a reference signal; and (b) an output circuit including an output amplifier, a temperature-dependent first resistive element having a positive first temperature coefficient;

(c) a second resistive element having a second temperature coefficient that is of substantially lower magnitude than the first temperature coefficient, the first and second resistive elements being coupled as a voltage divider between an output of the output amplifier and a reference conductor to provide a feedback signal to an input of the output amplifier, the output circuit being configured to produce a temperature-compensated output signal in response to the logarithmic voltage signal; and (d) serpentine interconnection material means included in the first resistive element and formed on the monolithic logarithmic amplifier circuit simultaneously with formation of interconnection elsewhere on the monolithic logarithmic amplifier circuit for providing sufficiently high resistance of a portion of the first resistive element to cause the output circuit to temperature-compensate the logarithmic voltage signal.

31. A temperature-compensated monolithic logarithmic amplifier circuit, comprising:

(a) a logarithmic amplifier cell configured to produce a logarithmic voltage signal representative of a difference between a first voltage developed across a first PN junction device in response to an input signal and a second voltage developed across a second PN junction device in response to a reference signal; and (b) an output circuit including an output amplifier, a temperature-dependent first resistive element having a positive first temperature coefficient, a temperature-dependent second resistive element having a positive second temperature coefficient, a third resistive element, and a fourth resistive element, the third and fourth resistive elements having temperature coefficients that are of substantially lower magnitude than the first temperature coefficient and/or the second temperature coefficient, the fourth and second resistive elements being coupled as a first voltage divider between an output of the output amplifier and a reference conductor, the third and first resistive elements being coupled as a second voltage divider between an output of the first voltage divider and the reference conductor to provide a feedback signal to an input of the output amplifier, the output circuit being configured to produce a temperature-compensated output signal in response to the logarithmic voltage signal, the first and second resistive elements each being at least partially composed of conductive material which is integral with a semiconductor manufacturing process utilized to fabricate the monolithic logarithmic amplifier circuit.

32. The temperature-compensated monolithic logarithmic amplifier circuit of claim 31 were in the first temperature coefficient is the same as the second temperature coefficient.

33. The temperature-compensated monolithic over the amplifier circuit of 31 were in the first temperature coefficient is different than the second temperature coefficient.

* * * * *